United States Patent
Chacin et al.

(10) Patent No.: US 8,372,203 B2
(45) Date of Patent: Feb. 12, 2013

(54) APPARATUS TEMPERATURE CONTROL AND PATTERN COMPENSATION

(75) Inventors: Juan Chacin, Palo Alto, CA (US); Aaron Hunter, Santa Cruz, CA (US); Craig Metzner, Fremont, CA (US); Roger N. Anderson, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1395 days.

(21) Appl. No.: 11/242,299

(22) Filed: Sep. 30, 2005

(65) Prior Publication Data

US 2007/0074665 A1   Apr. 5, 2007

(51) Int. Cl.
| | |
|---|---|
| C23C 16/48 | (2006.01) |
| C23C 16/46 | (2006.01) |
| C23C 16/458 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl. .................. 118/724; 118/730; 156/345.37; 156/345.52; 156/345.55
(58) Field of Classification Search .................. 118/724, 118/730; 156/345.37, 345.52, 345.55
See application file for complete search history.

(56) References Cited

U.S. PATENT DOCUMENTS

| | | | |
|---|---|---|---|
| 4,919,542 A | 4/1990 | Nulman et al. | |
| 4,956,538 A | 9/1990 | Moslehi | |
| 5,108,792 A | 4/1992 | Anderson et al. | |
| 5,156,461 A | 10/1992 | Moslehi et al. | |
| 5,180,226 A | 1/1993 | Moslehi | |
| 5,255,286 A | 10/1993 | Moslehi et al. | |
| 5,258,824 A | 11/1993 | Carlson et al. | |
| 5,273,588 A * | 12/1993 | Foster et al. | 118/723 E |
| 5,476,548 A * | 12/1995 | Lei et al. | 118/728 |
| 5,601,366 A | 2/1997 | Paranjpe | |
| 5,660,472 A | 8/1997 | Peuse et al. | |
| 5,738,440 A | 4/1998 | O'Neill et al. | |
| 5,755,511 A | 5/1998 | Peuse et al. | |
| 5,848,842 A | 12/1998 | Peuse et al. | |

(Continued)

FOREIGN PATENT DOCUMENTS

| | | | |
|---|---|---|---|
| EP | 0634786 | | 1/1995 |
| JP | 06-204143 | * | 7/1994 |

(Continued)

OTHER PUBLICATIONS

USPTO Non-Final Office Action mailed Sep. 19, 2008, U.S. Appl. No. 11/242,298, filed Sep. 30, 2005.

(Continued)

*Primary Examiner* — Rudy Zervigon
(74) *Attorney, Agent, or Firm* — Servilla Whitney LLC

(57) ABSTRACT

A film formation system 10 includes a processing chamber 15 bounded by sidewalls 18 and a top cover 11. In one embodiment, a susceptor 16 is rotatably disposed in the system 10, and overlaps with a first peripheral member 205 disposed around the sidewalls 18. A radiant heating system 313 is disposed under the susceptor 305 to heat the substrate 19. In another embodiment, the top cover 11 has equally spaced pyrometers 58 for measuring the temperature of the substrate 19 across a number of zones. The temperature of the substrate 19 is obtained from pyrometric data from the pyrometers 58.

27 Claims, 16 Drawing Sheets

U.S. PATENT DOCUMENTS

| | | | |
|---|---|---|---|
| 6,083,323 | A | 7/2000 | Carlson et al. |
| 6,179,466 | B1 | 1/2001 | Peuse et al. |
| 6,280,081 | B1 | 8/2001 | Blau et al. |
| 6,374,150 | B2 * | 4/2002 | Redinbo et al. ............... 700/121 |
| 6,455,814 | B1 * | 9/2002 | Samoilov et al. ............. 219/390 |
| 6,492,625 | B1 | 12/2002 | Boguslavskiy et al. |
| 6,790,687 | B2 | 9/2004 | Yoshimura |
| 6,881,277 | B2 | 4/2005 | Pan |
| 2002/0041620 | A1 | 4/2002 | Li et al. |
| 2003/0155072 | A1 | 8/2003 | Lee et al. |
| 2005/0191044 | A1 | 9/2005 | Aderhold et al. |
| 2006/0228897 | A1 | 10/2006 | Timans |
| 2007/0095812 | A1 | 5/2007 | Schietinger |

FOREIGN PATENT DOCUMENTS

| | | |
|---|---|---|
| JP | 7-161802 | 7/1994 |
| JP | 8-255800 | 12/1995 |
| JP | 2000-234872 | 8/2000 |
| JP | 2001/091361 | 4/2001 |
| JP | 2002/110582 | 4/2002 |

OTHER PUBLICATIONS

"PCT International Search Report in PCT/US06/35031", 4 pp.

"PCT Written Opinion in PCT/US06/35031", 6 pp.

"PCT International Search Report in PCT/US06/35263", (Jun. 26, 2008), 3 pp.

"PCT Written Opinion in PCT/US06/35263", (Jun. 26, 2008), 9 pp.

"PCT Notification Concerning Transmittal of International Preliminary Report on Patentability mailed Mar. 26, 2009—International Application No. PCT/US2006/035031 filed Sep. 11, 2006", 7 pgs.

"PCT International Search Report mailed Jun. 10, 2008—International Application No. PCT/US06/35031 filed Sep. 11, 2006", 6 pgs.

"PCT Written Opinion mailed Jun. 10, 2008—International Application No. PCT/US06/35031 filed Sep. 11, 2006", 6 pgs.

"Final Office Action mailed Apr. 13, 2009 for U.S. Appl. No. 11/242,298, filed Sep. 30, 2005", 11 pgs.

PCT International Search Report and Written Opinion in PCT/US2006/035263, (Apr. 16, 2009), 11 pgs.

* cited by examiner

APPARATUS TEMPERATURE CONTROL AND PATTERN COMPENSATION

TECHNICAL FIELD

Embodiments of the invention generally relate to reaction chambers and film formation apparatus and methods.

Over the last several years, there has been a significant increase in the number of applications requiring low temperature deposition of single crystal silicon films. Examples of such applications include but are not limited to blanket silicon germanium films, elevated and/or recessed source drain selective deposition, films with either tensile or compressive strains, etc. Depending on the particular application, these processes can all differ greatly in the pressure, temperature and chemicals that are used to grow the films. However, one requirement these processes have in common is that they all require very careful, accurate and uniform control of the temperature of the wafer.

Single wafer silicon deposition CVD chambers (for both 200 mm and 300 mm applications) have been available for many years now. This equipment, however, was designed primarily with high temperature (about 1100° C.) blanket atmospheric epitaxial conditions in mind. There are several factors that impact the performance of such equipment when transitioning from such high temperature applications to newer, lower temperature applications.

First, high temperature atmospheric epitaxial applications that use trichlorosilane as the silicon precursor gas are mass-transport limited processes. This means that the chemical deposition reactions occur very quickly as compared to the rate at which reactants are delivered to the surface, and the main factor in determining the uniformity of the silicon film is the uniformity of the gas flow. Temperature control in such applications is a secondary factor. By way of example, for a typical 3 micron 1130° C. atmospheric epitaxial process, each degree Celsius of temperature error (either global or across the wafer) will produce a film thickness deviation of 0.004 microns, or just 0.13%. At typical industry uniformity requirements of about 0.8% for 1σ, this means that the chamber need only maintain about 6° C. for 1σ of temperature uniformity across the wafer. This specification is relatively easy to meet. As known in the art, σ is a statistical term that is used to denote the standard deviation of the data. Film thickness is typically measured at a number of points, and σ indicates the way in which a probability function, or a probability density function, is centered around its mean.

Lower temperature epitaxial applications, on the contrary, fall into the category of reaction-rate limited processes. At typical process temperatures (for example, between about 600 and 900° C.), the reaction on the substrate surface is slow compared to the rate of gas transport to the surface, and global temperature and temperature uniformity across the substrate are the most important process parameters controlling film properties. By way of example, a typical selective epitaxial film may be about 300 Å thick, with a required uniformity of about 1.0% for 1σ, and this value gets smaller with each new device generation. In this regime, every degree Celsius of temperature variation produces about 3 Å of film thickness variation. A uniformity of 1% for 1σ in uniformity translates into about 1° C. for 1σ of temperature control. Thus, a factor of six in improvement over the current generation of epitaxial deposition equipment is required for such process control.

A second factor that affects equipment performance for these new processes is the need to account and correct for wafer emissivity, which affects both the accuracy of the temperature measurements as well as the rate and manner in which the wafer is heated by radiation lamps, radiation lamps being the technology of choice for these reactors. The current generation of epitaxial chambers was designed mainly to process blanket silicon wafers, which have constant and uniform emissivity characteristics across the entire substrate surface. Because of this, emissivity effects could simply be calibrated into the equipment. The emerging selective low temperature processes are targeted towards device wafers (wafers with integrated circuits partially printed on them), which means that emissivity is neither a known factor nor is this property constant across the wafer.

It would be desirable to provide epitaxial equipment that is capable of compensating for this variation while still maintaining the tight temperature control that is required. Therefore, film formation systems that provide tighter temperature monitoring and control, as well as emissivity and pattern compensation, are highly desirable.

DISCLOSURE OF THE INVENTION

Aspects of the present invention pertain to film formation systems that provide precise monitoring and control of the temperature of a substrate. In one embodiment, a processing chamber is bounded by a sidewall. A first peripheral member, having an inner peripheral edge that extends into the processing chamber, is disposed around at least a portion of the sidewall. A substrate support, such as a susceptor, is disposed within the system. An outer edge portion of the substrate support overlaps with the inner peripheral edge of the peripheral member, thereby blocking light that emanates from below the substrate. In one embodiment, the substrate support may be rotatably mounted within the system, and the inner peripheral edge of the peripheral member does not touch the outer edge of the substrate support. In another embodiment, either of the overlapping surfaces may be roughened, or grooved, to enhance light-scattering or light-absorbing effects; optically active thin films may also be used to enhance the absorptivity of the overlapped surfaces. In yet another embodiment, a second peripheral member or light shield may be disposed adjacent to the sidewall that extends into the processing chamber to overlap above the inner and outer ends of the peripheral member and substrate support.

In another embodiment of the invention, a top cover is provided for covering the processing chamber. According to this embodiment, the top cover is disposed above the substrate support, and comprises a reflective surface that reflects light back towards the substrate support. In one embodiment, the reflective surface is designed to reflect light emanating from the substrate back onto the substrate so as to increase the effective emissivity of the substrate. In another embodiment, a plurality of optical probes may be provided to collect light emanating from the substrate to measure the temperature at various locations. The reflective surface may have a plurality of openings, each of which provides a field of view for a respective optical probe. In one embodiment, the field of view for the optical probes does not extend beyond the substrate. In another embodiment, all of the optical probes are substantially equidistantly spaced along the radial direction of the substrate. The optical probes may comprise optical pyrometers and fiber optics for carrying signals to signal processing equipment.

In another embodiment, an emissometer for measuring the active emissivity of the substrate may be provided. The temperature of the substrate may then be determined utilizing the output from the emissometer and one or more of the temperature probes. In one embodiment, the emissometer comprises an opening in the reflective surface that is wide enough to substantially eliminate, within the area of the opening, the increased effective emissivity caused by the reflective surface; a hot mirror may be provided to cover this opening, which may reflect off-axis light back onto the substrate. An optical probe is provided to collect light emanating from the substrate that passes through the hot mirror.

In another aspect of the invention, a heating system that exclusively provides the heating required for the film-formation process is disposed below the substrate. In one embodiment, the substrate support is a susceptor that heats the substrate through conduction and radiation. The bottom portion of the susceptor entirely covers the bottom surface of the substrate. In another embodiment, the bottom portion of the susceptor is designed to be highly absorbent of light emitted by the heating system. The susceptor may be made from a uniform material that is a good thermal conductor, such as graphite. In one embodiment, the heating system comprises a plurality of lamps, with each lamp heating a predefined, specific zone across the substrate. The zones may overlap each other to provide a substantially uniform heating distribution across the substrate.

BEST MODE FOR CARRYING OUT THE INVENTION

Several exemplary embodiments of the present invention are disclosed herein. It should be understood, however, that the disclosed embodiments are merely exemplary of the invention, which may be embodied in many forms. Therefore, the details disclosed herein are not to be interpreted as limiting, but merely as the basis for claims and as a basis for teaching one skilled in the art how to make and use the invention.

Figure 1A:
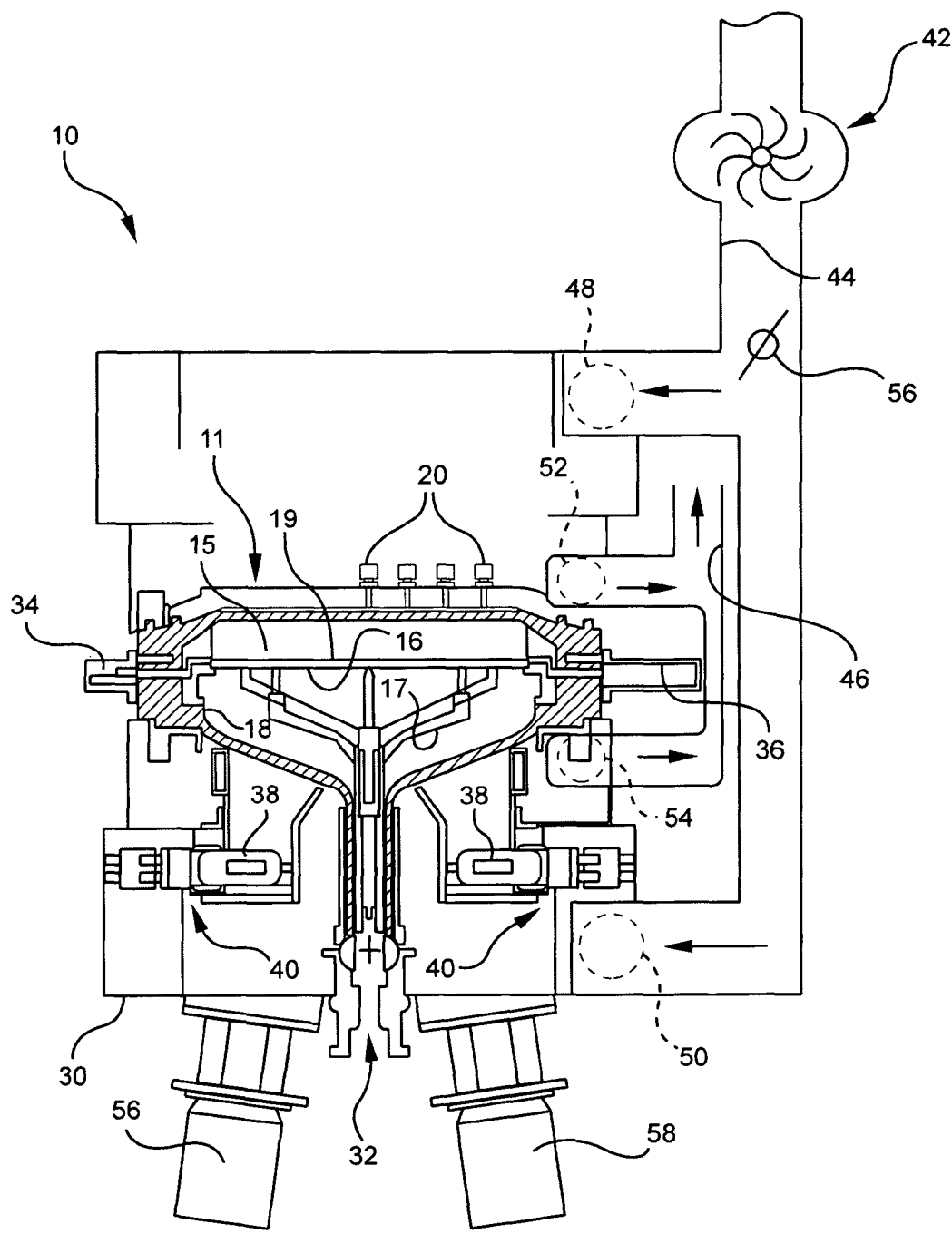
FIG. 1A is a cross-sectional view of an embodiment of a film formation system.
Figure 1B:
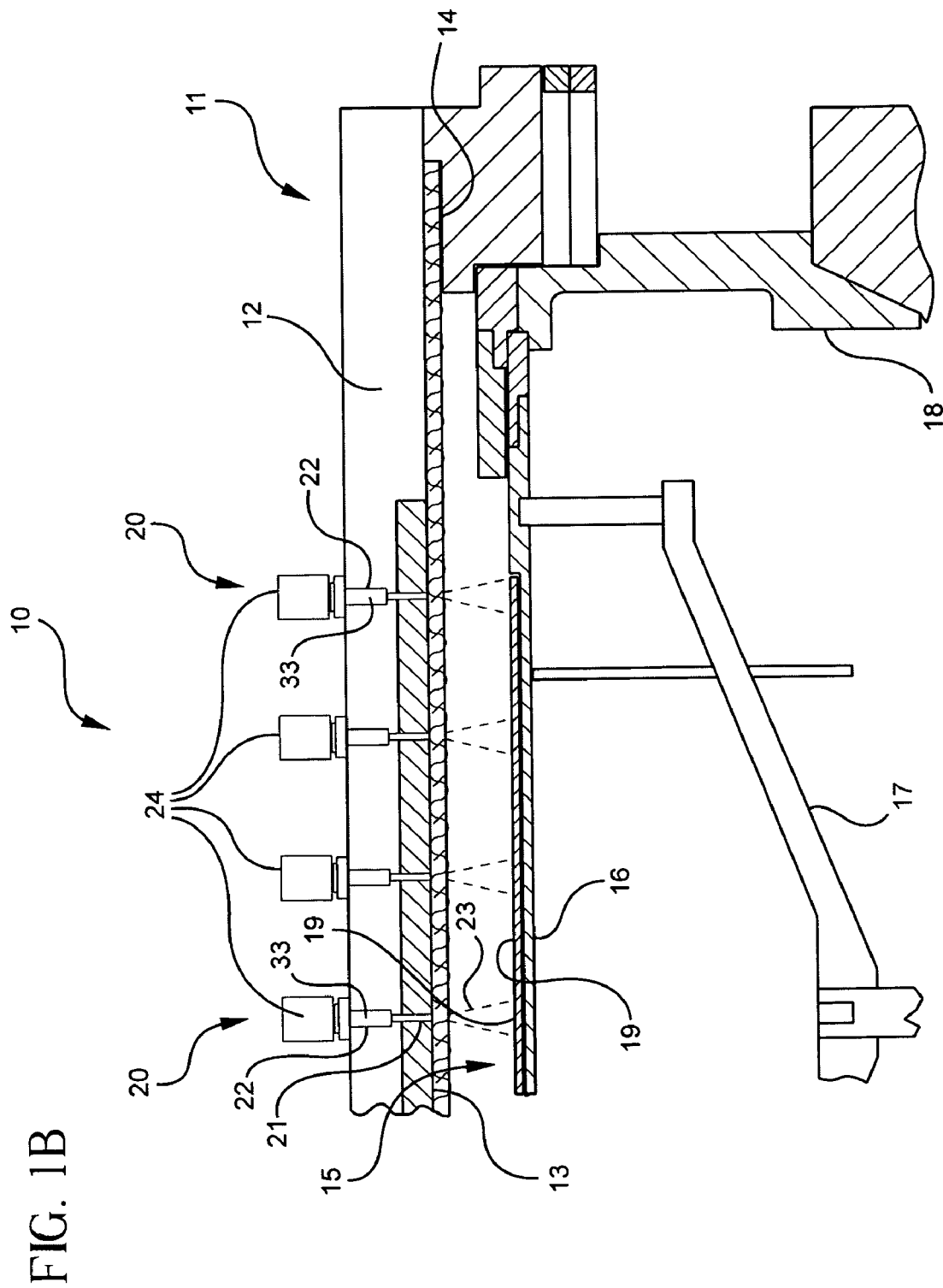
FIG. 1B is a partial cross-sectional view of the film formation system depicted in FIG. 1A.

A schematic view of a film formation system 10 is shown in FIGS. 1A and 1B. The system 10, which may be, for example, a CVD epitaxial system, a poly silicon or silicon nitride deposition system, or any other film deposition system for hot CVD processes, i.e., CVD processes that are around 400° C. or greater. The system 10 includes a processing chamber 15 bounded by sidewalls 18. Examples of such systems are disclosed in commonly assigned U.S. Pat. Nos. 5,108,792; 5,258,824; and 6,083,323, each of which is incorporated herein by reference. The sidewalls 18 may be made from quartz to protect equipment from the flammable and corrosive process gases used in silicon deposition. A substrate support shaft 17 is rotatably disposed within the processing chamber 15, and includes a substrate support 16 upon which may be placed a substrate 19 that is to be processed. As used herein, the term substrate support may include any device that is used to support the substrate 19 within the chamber 15, and may include, for example, a susceptor that supports the substrate 19 across the entire bottom surface of the substrate 19, a ring-shaped support that supports the substrate 19 only along the peripheral edges of the substrate 19, a tripod-like configuration that supports the substrate 19 at three or more points on the bottom of the substrate 19, a configuration that supports the substrate 19 at three or more points along the edge of the substrate 19, etc. A top surface of the substrate 19, upon which a film is to be formed, faces up, while the bottom surface of the substrate 19, or portions thereof, contacts the substrate support 16. During the film formation process, the substrate support 16 may rotate, thus rotating the substrate 19. In one embodiment, the substrate support 16, in the form of a susceptor, may be made from a material with uniform properties, good thermal conductivity (100 Watts/(meter ° C.) or better) and a low mass, such as graphite, silicon carbide coated graphite, solid silicon carbide, alumina and other suitable ceramic materials.

The top of the processing chamber 15 may be sealed by top cover 11. Top cover 11 is disposed above the substrate support 16, and hence above the substrate 19. Top cover 11 includes an outer cover 12, an inner cover 14 and, in one embodiment, a reflective surface 13 abutting the inner cover 14. The inner cover 14 may be made of quartz, and the outer cover 12 may be made of steel to protect the relatively fragile inner cover 14 and sidewalls 18. The reflective surface 13 may be made from a gold film, or any other highly reflective material, sandwiched between the outer cover 12 and inner cover 14. Several different optical stacks may also form the reflective surface 13, including nickel covered with silicon dioxide; a simple aluminum surface polished to a mirror finish may also be used. The reflective surface 13 is designed to reflect light emanating from the substrate 19 back onto the substrate 19. As discussed in more detail later, the reflective surface 13 creates an enhanced emissivity effect for the substrate 19.

A housing 30 envelopes and supports the chamber 15. The susceptor support shaft 17 extends through a bottom aperture 32 of the chamber 15. Such an extension enables a drive assembly (not shown) to rotate the susceptor support shaft 17, and thus the substrate 19, during processing. Such rotation is accomplished to enhance process uniformity.

During processing, gases enter the chamber 15 through an entry port 34 and are removed through an exhaust port 36. Also during processing, heat is provided by radiation bulbs 38, which in some embodiments are infrared radiation bulbs.

The radiation bulbs 38 are mounted, proximate the chamber 15, on a support assembly 40 connected to a housing 30. The sidewalls 18 of the chamber 15 are transparent, allowing infrared radiation from the radiation bulbs 38 to freely enter the reaction chamber 15 for heating of the substrate 19.

During processing, the quartz windows (e.g., accessible portions of the transparent chamber sidewalls), although transparent, still become heated. A coolant flow for cooling the chamber sidewalls 18 is supplied to the housing 30 from a blower 42 via inlet conduit 44, directed past the outside surface of the sidewalls 18 and exhausted through outlet conduit 46. More specifically, the coolant flow is supplied via conduit 44 to housing 30 through upper and lower inlet ports 48 and 50. The coolant flow exits the housing 30 through upper and lower exhaust ports 52 and 54. The housing 30 forms a shroud that channels the coolant past the chamber sidewalls 18. Typically, the coolant is air. An air vane 56 or other coolant flow control device, located in the inlet conduit 44, controls the amount of air flow to the housing 30 and, in turn, controls the temperature of the sidewalls 18 of the chamber 15. Alternatively, other devices for controlling the coolant flow may be used, such as an adjustable iris, a valve, blower speed control circuitry and the like.

The temperature of the quartz chamber sidewalls 18 may be monitored using a conventional optical pyrometer 58. The optical pyrometer 56 should be capable of measuring temperatures in the range of 100 degrees centigrade to 800 degrees centigrade, and of detecting a wavelength of between 4.8 and 5.2 microns. Such an optical pyrometer is available from Ircon, Inc. having a business address of 7300 North Natchez Avenue, Niles, Ill. 60648, or from Linear Labs, having a business address of 1290 Hammerwood Avenue, Sunnyvale, Calif. 94089. Optical pyrometer 58 may be used to measure the temperature of the substrate support 16, and in one embodiment is capable of measuring temperatures in the range of 350 degrees centigrade to 1300° C., detecting at a wavelength of about 905 nanometers. Such a pyrometer is available, for example, from Sekidenko. Selection of the 905 nanometer wavelength provides good signal discrimination, and reduces changes of substrate 19 emissivity with substrate 19 temperature.

Referring now to FIG. 1B, the film formation system 10 further includes a plurality of optical probes 20 for collecting light emanating from the substrate 19. The optical probes 20 are located above the substrate 19, and may be disposed along the radius of the substrate 19 at substantially equal radial distances. The optical probes 20 may be mounted on, or in, the outer cover 12. In certain embodiments, at least four optical probes 20 are provided, but the number of optical probes 20 can be increased or decreased as needed to improve performance or reduce costs. Each optical probe 20 is directed towards the top surface of the substrate 19, through a respective opening 21 in the reflective surface 13 and openings 22 in outer cover 12, to directly measure the temperature of the substrate 19. Each optical probe 20 has an enlarged field of view, indicated by dashed lines 23, engineered to collect as much radiation from the substrate 19 as possible, but without monitoring radiation beyond the edge of the substrate 19. Hence, in the depicted embodiment, the field of view 23 of every optical probe 20 is confined within the substrate 19 and does not extend outside the substrate 19. Each optical probe 20 may comprise, for example, a 2 mm sapphire light pipe 33 disposed within the openings 21, 22 and optically connected to a 905 nm optical filter 24. The light pipe 33 may end flush with the reflective surface 13. As known in the art, the optical probes 20 may be connected to signal-processing electronics using fiber optic cables, and the signal collected by the optical probes 20 can be converted to a corresponding temperature by the signal-processing electronics, which then reports the temperature to a control system that uses the temperature information to adjust heating power as needed to maintain a uniform temperature across the substrate 19. Alternatively, the signal processing circuitry may be mounted with the optical filter 24, which may be desirable in some situations as such a configuration reduces signal loss associated with fiber optic cable. In either configuration, the optical probes 20 function as pyrometers that measure the top surface temperatures within their respective fields of view 23 of the substrate 19.

The energy to heat the substrate 19 comes from an irradiative heating system located underneath the substrate 19. The design of the irradiative heating system is discussed in more detail later herein.

A factor that introduces potentially large errors in pyrometry obtained from the optical probes 20 is the emissivity of the substrate 19. Planck's law quantifies the relationship between temperature and radiation:

$$\Phi(\lambda, T) = \varepsilon \frac{2\pi C_1}{\lambda^5 \left(e^{C_2/\lambda T} - 1\right)} \qquad \text{Eqn. 1}$$

Figure 2:
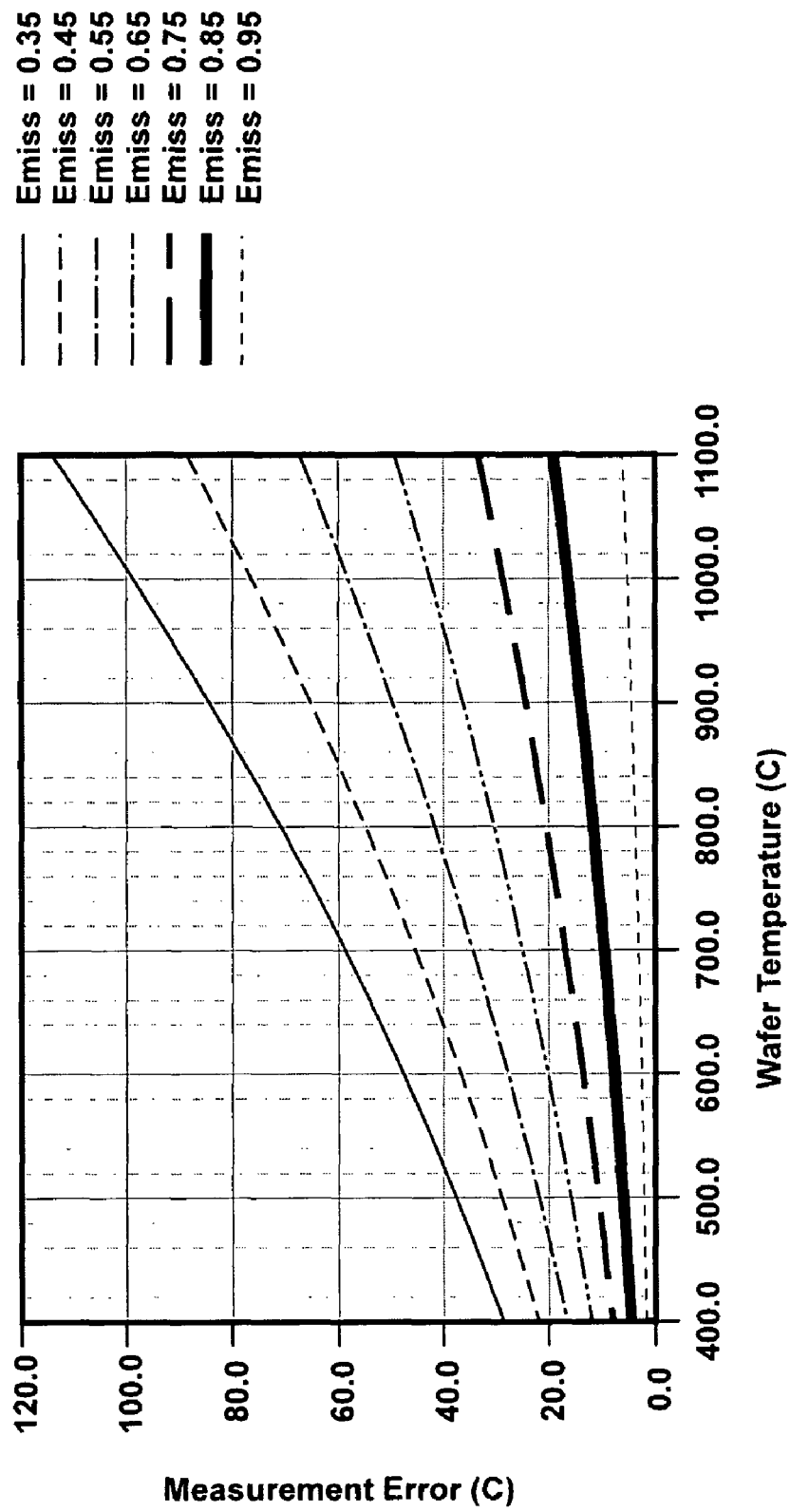
FIG. 2 is a graph illustrating temperature measurement errors as a function of substrate temperature for substrates with different emissivity values.

In Eqn. 1, $\phi$ is the radiative power, which is the actual quantity measured by the pyrometers 20; $C_1$ and $C_2$ are constants; $\lambda$ is the radiation wavelength (which may be, for example, 905 nm in the embodiment described above); T is the temperature of the substrate 19 and $\epsilon$ is the emissivity of the substrate 19. If the emissivity is known, Planck's law can be used to calculate the temperature of the substrate 19 very precisely. If this emissivity is not known, then it is not possible to perform an accurate temperature calculation, and the error incurred can be large depending on the difference between the assumed emissivity and the actual emissivity. FIG. 2 shows the magnitude of the theoretical temperature measurement error that can be incurred for substrates 19 of different emissivities if the assumed emissivity is set to 1.0. For example, if a substrate 19 with an emissivity of 0.35 is measured assuming, incorrectly, that it has an emissivity of 1.0, the error made at 800° C. would be close to 70° C. For selective silicon deposition applications, it can be expected that substrates 19 with a wide range of emissivities will need to be processed, and these emissivities may not be known ahead of time.

Figure 3:
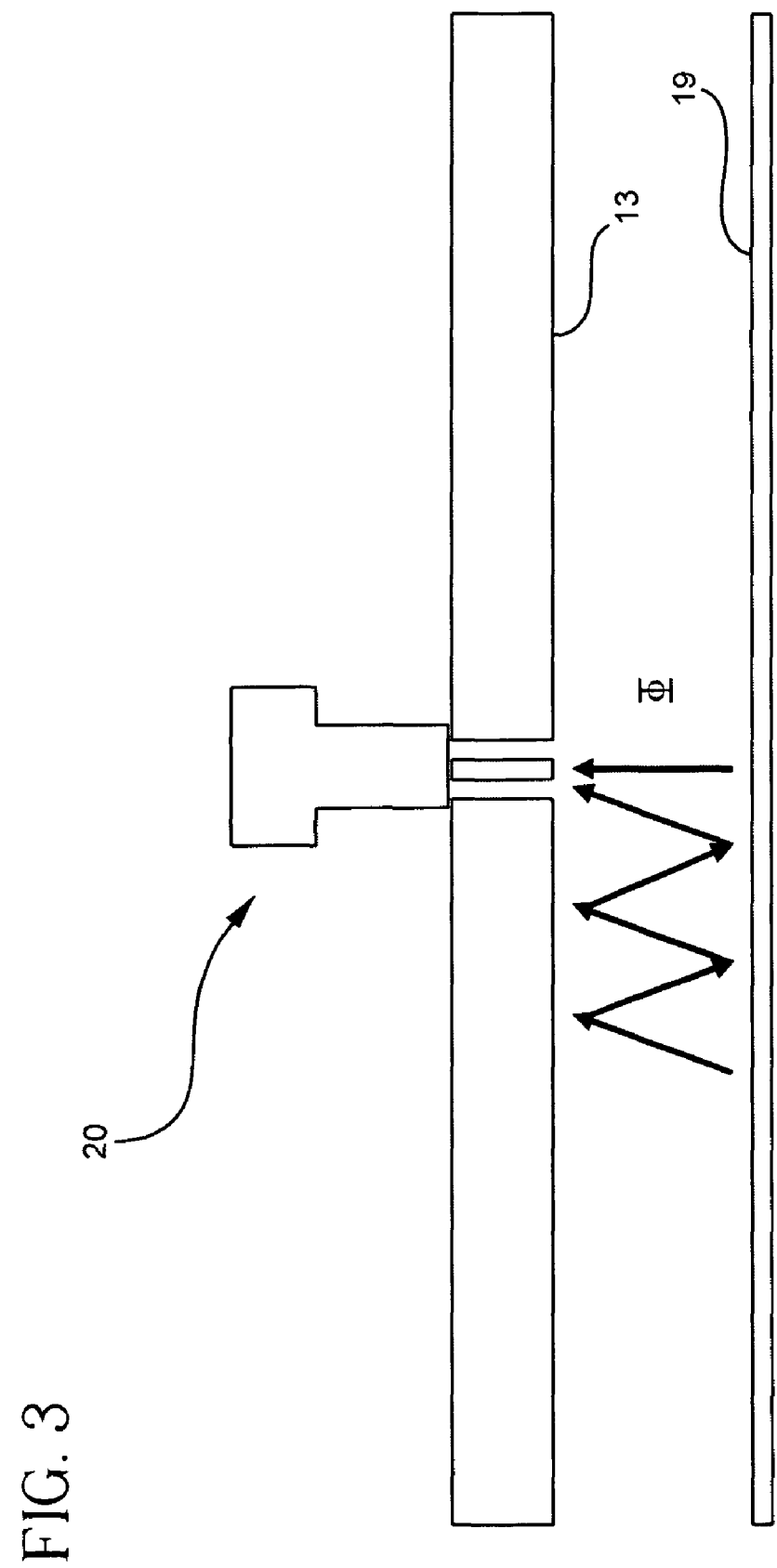
FIG. 3 illustrates enhanced emissivity effects according to one embodiment.

As discussed with reference to FIG. 1B, one embodiment provides a highly reflective surface 13 situated right above the substrate 19. The reflective surface 13 traps the light radiation emitted by the substrate 19 and reflects this light radiation back and forth between itself and the substrate 19, creating an emissivity enhancement effect. The mechanism involved may be explained with reference to FIG. 3. An optical probe 20 disposed above the reflective surface 13 will receive not only the direct emission from the substrate 19, indicated by $\phi$ in FIG. 3, but also a number of reflections between the two surfaces 13, 19. The total radiative power reaching the optical probe 20 with the reflective surface 13 would be:

$$\Phi(\lambda, T) = \varepsilon(1 + (1-\varepsilon)R + (1-\varepsilon)^2 R^2 + \ldots) \frac{2\pi C_1}{\lambda^5 \left(e^{C_2/\lambda T} - 1\right)}$$

where R is the reflectivity of the reflective surface 13 (which is close to 1.0). This equation can be written as:

$$\Phi(\lambda, T) = \varepsilon_{apparent} \frac{2\pi C_1}{\lambda^5 (e^{C_2/\lambda T} - 1)}$$

where:

$$\varepsilon_{apparent} = \varepsilon(1 + (1-\varepsilon)R + (1-\varepsilon)^2 R^2 + \ldots)$$

It can be readily calculated that $\epsilon_{apparent}$ tends to 1.0 for any actual value of E and R, and in particular for values of R that are close to 1.0. This means that, regardless of the actual emissivity of the substrate 19, the optical probes (or pyrometers) 20 see a target with an effective emissivity that is close to 1.0.

Figure 4:
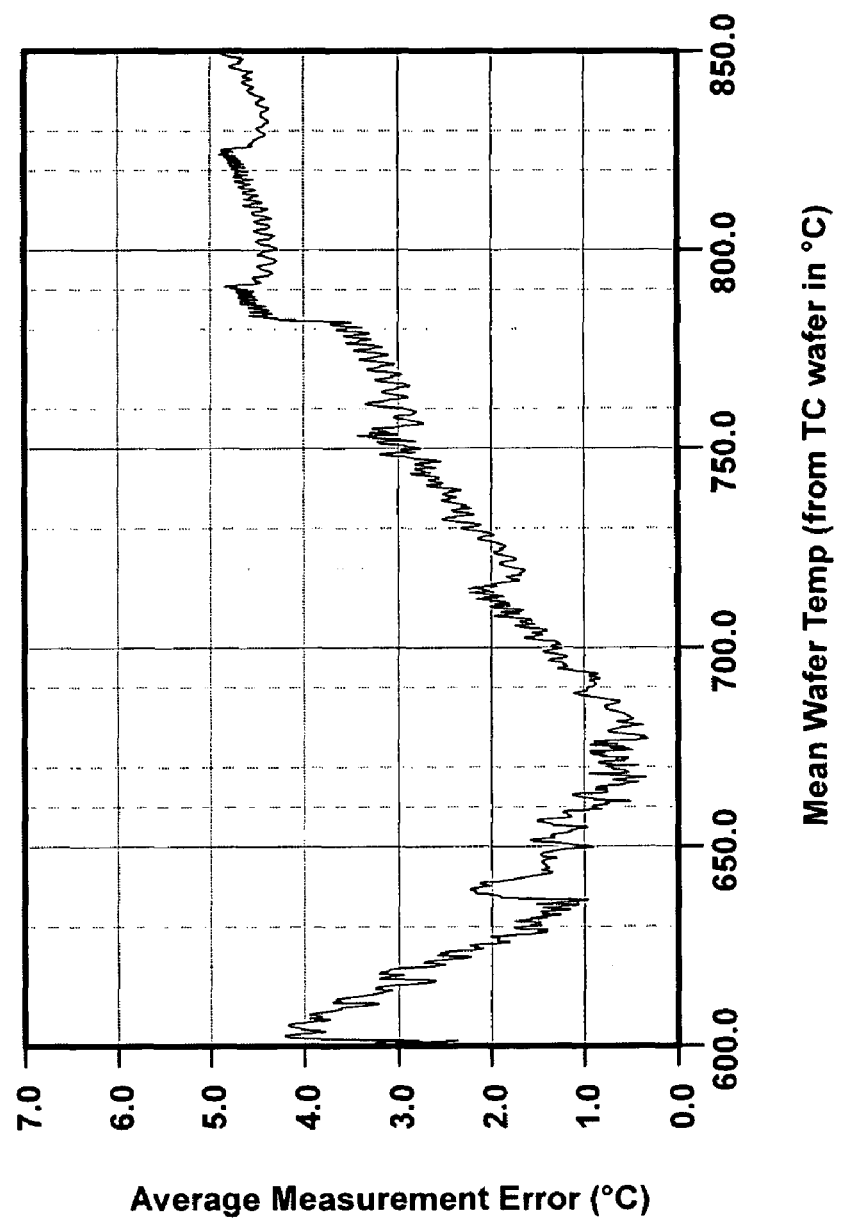
FIG. 4 is a graph of average pyrometric temperature measurement errors as a function of mean wafer temperature as measured by thermocouples.
Figure 5:
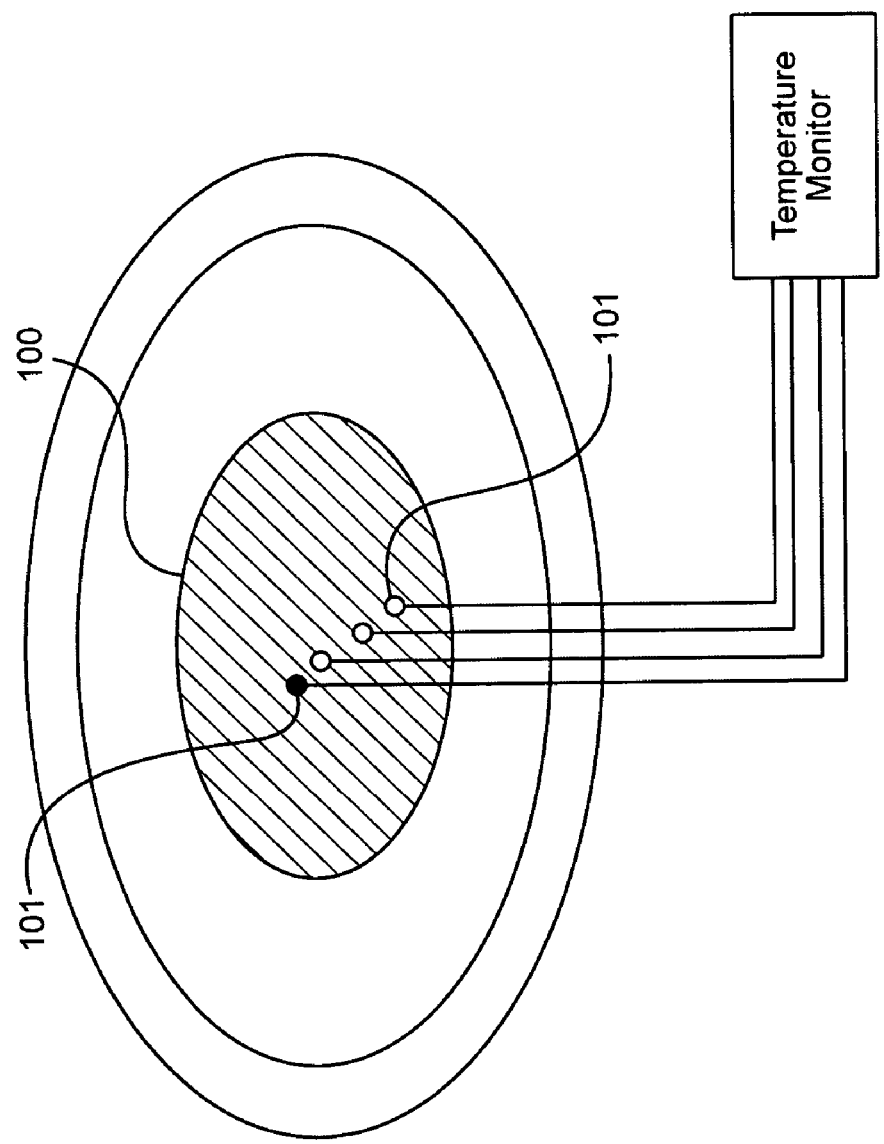
FIG. 5 is a perspective view of a test wafer with thermocouples.

The reflective surface 13 is thus highly effective in compensating for variations in substrate 19 emissivity. FIG. 4 shows the measured magnitude of the temperature error caused by emissivity effects. With further reference to FIGS. 1 and 5, a test substrate 100 with a very low emissivity top surface (a polysilicon film with an emissivity of about 0.35) was fitted with thermocouples 101. The thermocouples 101 were located at the same radii as the optical probes 20 so that temperature measurements taken by the two techniques could be compared. FIG. 4 is a graph of the difference between the temperature measured by the optical probes 20 and the temperature measured by the thermocouples 101 as a function of the actual temperature of the substrate 100 as measured by the thermocouples 101. As shown in FIG. 4, the error due to emissivity is less that 5° C. for temperatures up to 850° C. With reference to FIG. 2, it can be seen that without the enhanced effective emissivity created by the reflective surface 13, the measurement error for a substrate 19 with an emissivity of 0.35 would instead be in excess of 70° C. at a temperature of 850° C. The reflective surface 13 thus reduces emissivity-induced errors by over 90%.

Figure 6:
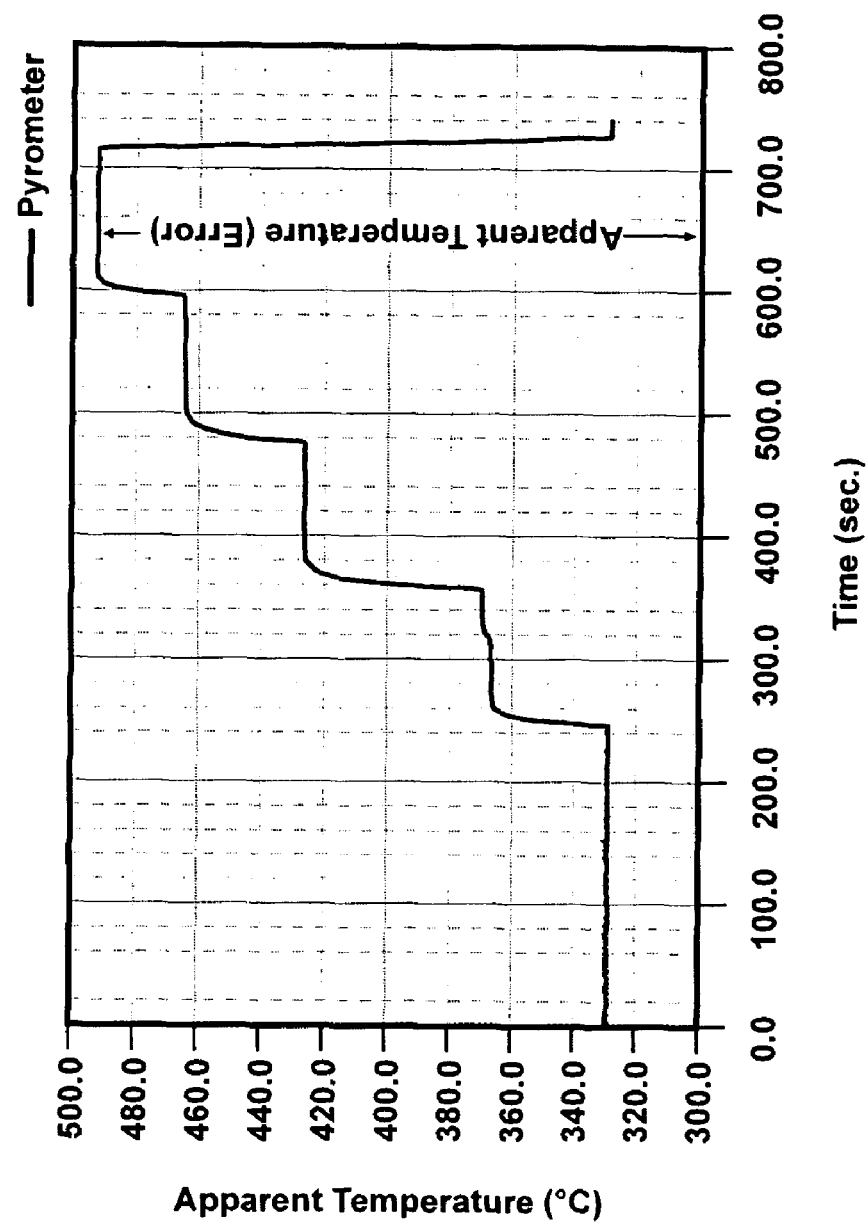
FIG. 6 is a graph illustrating pyrometric temperature measurement errors caused by stray lamp radiation.

Another problem encountered when using pyrometry for radiantly heated processing chambers is stray radiation. With reference to FIG. 1, the substrate 19 may be heated using an irradiative heating system. The irradiative heating system uses one or more lamps 38 to heat the substrate 19. Consequently, the chamber 15 tends to be flooded with light. One problem with this arrangement is that the light produced by the irradiative heating system is almost indistinguishable from the light radiated by the substrate 19. This means that the pyrometers 20 will collect both of these components, radiation from the substrate 19 and radiation from the heating system, and interpret all of this radiation as having been produced by the substrate 19. This results in a direct measurement error that can easily reach hundreds of degrees Celsius in magnitude. For example, FIG. 6 is a graph providing comparative data of pyrometer temperature readings when little or no stray radiation blocking features are utilized. In FIG. 6, the data was taken by increasing the lamp power of the irradiative heating system in steps at a fast enough rate that the chamber didn't have time to heat up. The actual substrate temperature, measured with a thermocouple, never exceeded 140° C. during the entire test. All jumps in the apparent temperature shown in the graph, as measured by pyrometers, are direct measurement errors caused by stray radiation. As shown in FIG. 6, this error reached in excess of 300° C.

Figure 7:
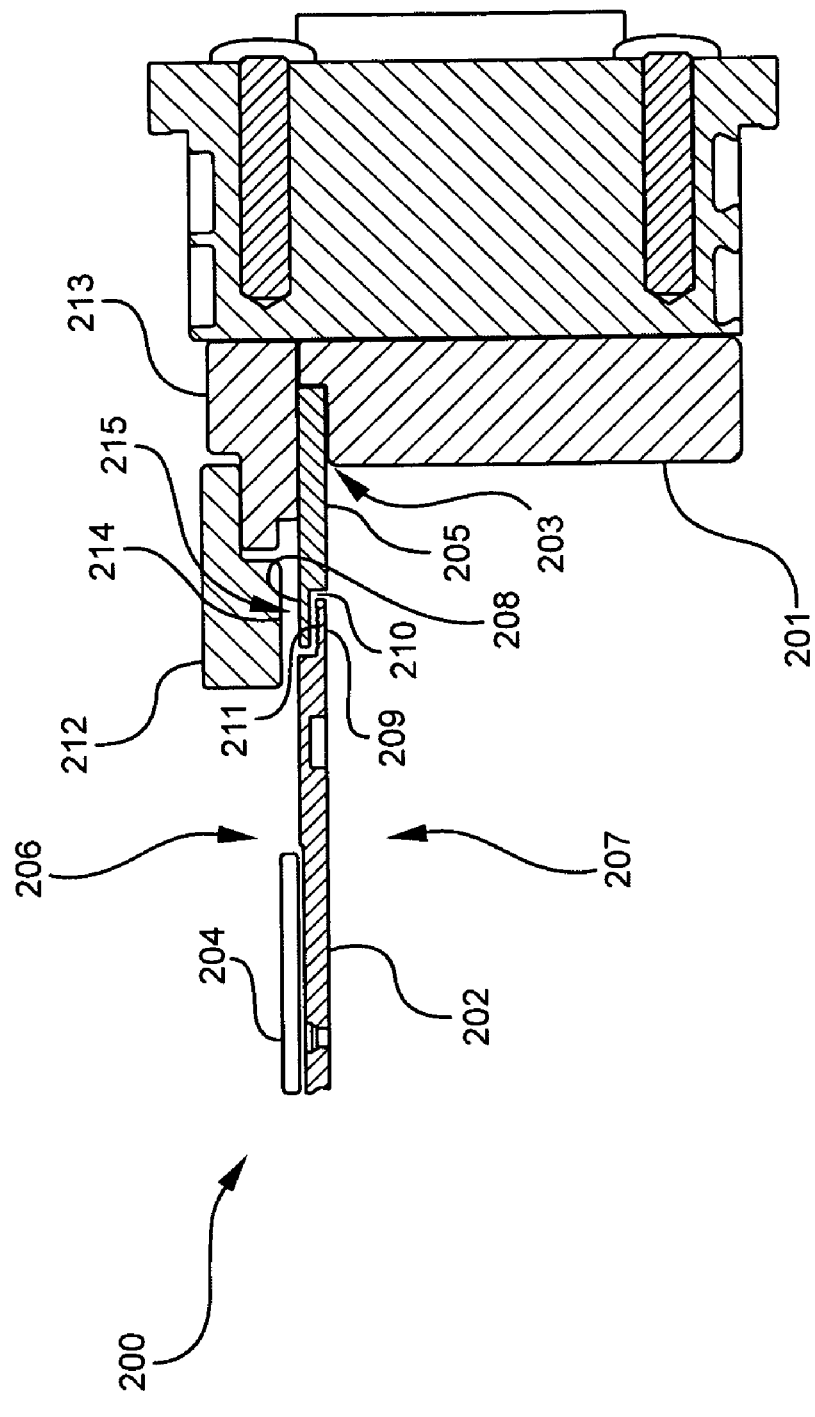
FIG. 7 is a partial cross-sectional view of another embodiment of a film formation system.
Figure 8:
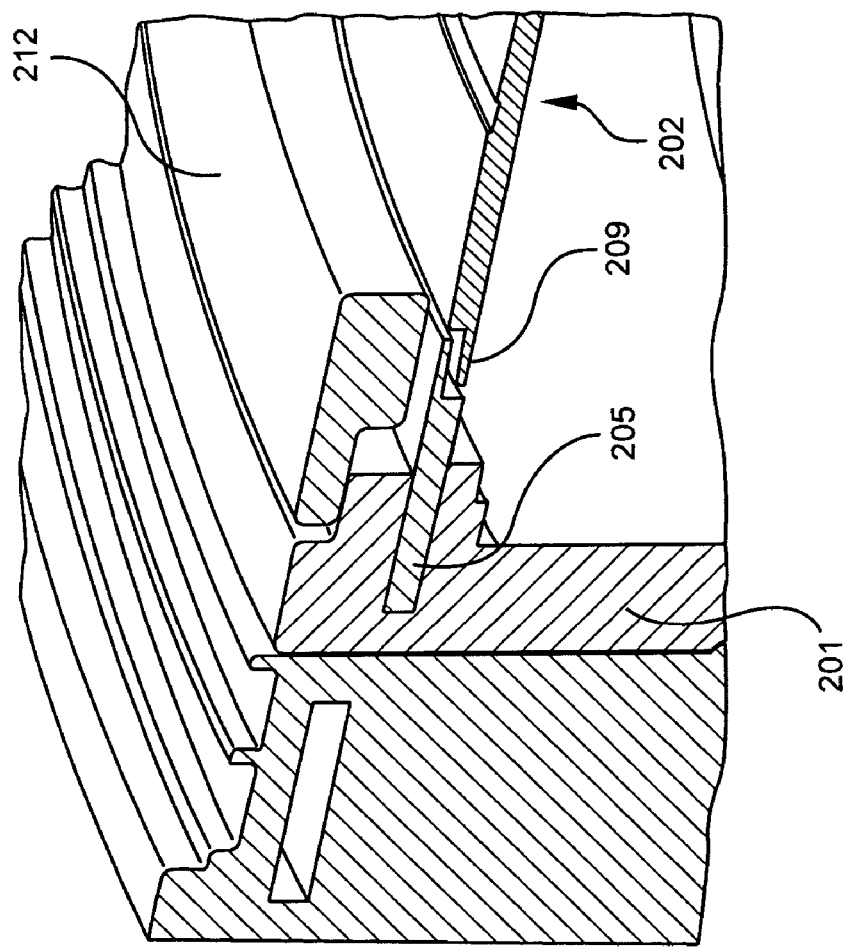
FIG. 8 is an enlarged partial perspective view of the embodiment depicted in FIG. 7.

One aspect of the invention provides system components and features to minimize problems associated with stray radiation, and an embodiment of this aspect is depicted in FIGS. 7 and 8. A system is shown including a processing chamber 200 that is enclosed by sidewalls 201, which may be made from quartz. Rotatably disposed within the system, as described above with respect to FIG. 1, is a substrate support 202 that is used to hold a substrate 204 during the film formation process. All of the process heating that is required for the film formation process is provided by an irradiative heating system, which is disposed below the substrate support 202, and hence below the substrate 204. The film formation system may be thought of as being divided into two regions: an upper region 206 above the substrate 204, and a lower region 207 that is below the substrate support 202. Since the irradiative heating system may be located exclusively in the lower region 207, it is desirable to prevent light from the irradiative heating system from entering the upper region 204, as this is where the pyrometers (or optical probes) are located for measuring the temperature of the substrate 204.

Disposed around at least a portion of the sidewalls 201 is a peripheral member 205. Ledges and pockets may be designed in the sidewalls 201 and peripheral member 205 to keep these two components from moving with respect to each other, and an outer peripheral edge of peripheral member 205 contacts a retaining edge 203 of the sidewall 201. The peripheral member 205 may be, for example, a pre-heat ring. The peripheral member 205 may be made of graphite, and keeps light from transmitting through the sidewalls 201 into the processing chamber, which may be made of quartz and which may therefore be transparent or translucent. The peripheral member 205 comprises an inner end 208 that extends into the processing chamber 200. This inner end 208 overlaps with an outer end 209 of the substrate support 202. Hence, the peripheral member 205 and the substrate support 202 have respective overlapping inner and outer edge portions 208, 209. A gap 210 may be provided between the rotating substrate support 202 and the stationary peripheral member 205. The width of the gap 210, which separates the overlapping ends 208, 209 may be made as small as possible to keep the amount of light passing through the gap 210 down to a minimum, and in one embodiment is 0.075 inches wide. By providing a set of overlapping surfaces 208, 209, most of the light emanating from the lower region 207 is blocked from entering into the upper region 206. The overlapping surfaces 208, 209 may include a stepped feature at the outer peripheral edge of substrate support 202 and at the inner peripheral edge of peripheral member 205. The stepped features of the substrate support 202 and peripheral member 205 are shown as being complementary. It is noted that by providing a complementary stepped design between the outer peripheral edge 209 of substrate support 202 and inner peripheral edge 208 of peripheral member 205, the top surface of inner peripheral edge 208 does not rise above the top surface of substrate support 202.

To further prevent light from the lower region 207 from escaping into the upper region 206 via the gap 210, the overlapping surfaces 208, 209 may be provided optically rough finishes that are designed to scatter and absorb light. For example, the top surface of the outer end 209 of the substrate support 202 may be machined to provide a series of narrow grooves 211. The bottom surface of the inner end 208 of the peripheral member 205 may be similarly provided with a grooved surface. Although grooves are used, it should be understood that any suitable surface that absorbs light may be used for the overlapping surfaces 208, 209, such as other types of angled surfaces, or optical films designed to absorb the radiation emitted by the irradiative heating system.

To further block stray radiation, the embodiment depicted in FIGS. 7 and 8 further provides an upper peripheral member, or light shield 212. The upper light shield 212 may be made from graphite, and is disposed above the overlapping ends 208, 209 of the peripheral member 205 and susceptor 202. The upper light shield 212 may be disposed on, or adjacent to, upper sidewall 213. The upper sidewall 213 may be made from quartz. Ledges and pockets may be designed in the upper sidewall 213 and light shield 212 to keep these two components from moving with respect to each other. A gap 215 may separate the lower surface 214 of the upper light shield 212 from the top surfaces of the substrate support 202 and peripheral member 205 so as not to interfere with the rotation of the susceptor 202. The lower surface 214 of the upper light shield 212 may similarly be provided an optically rough or absorbent surface, such as a series of fine grooves or optically active films, to absorb light emanating from the gap 210. The upper light shield 212 may follow the entire perimeter of the sidewalls 201, 213. Although depicted as discrete elements, upper sidewall 213 and lower sidewall 201 may be made from a monolithic element, manufactured with appropriate grooves or the like to accept the peripheral member 205.

It should be noted that it is not necessary for the substrate support 202 to completely cover the bottom surface of the substrate 204, as is the case if a susceptor is used for the substrate support 202. Instead, an edge ring may be used for the substrate support 202, in which case the substrate support 202 only supports the substrate 204 by the edges of the substrate 204. In this case, the heating system would directly heat the bottom of the substrate 204. Such a configuration may be advantageous in that is reduces the weight of the system, which allows temperatures to be ramped very quickly.

Figure 9:
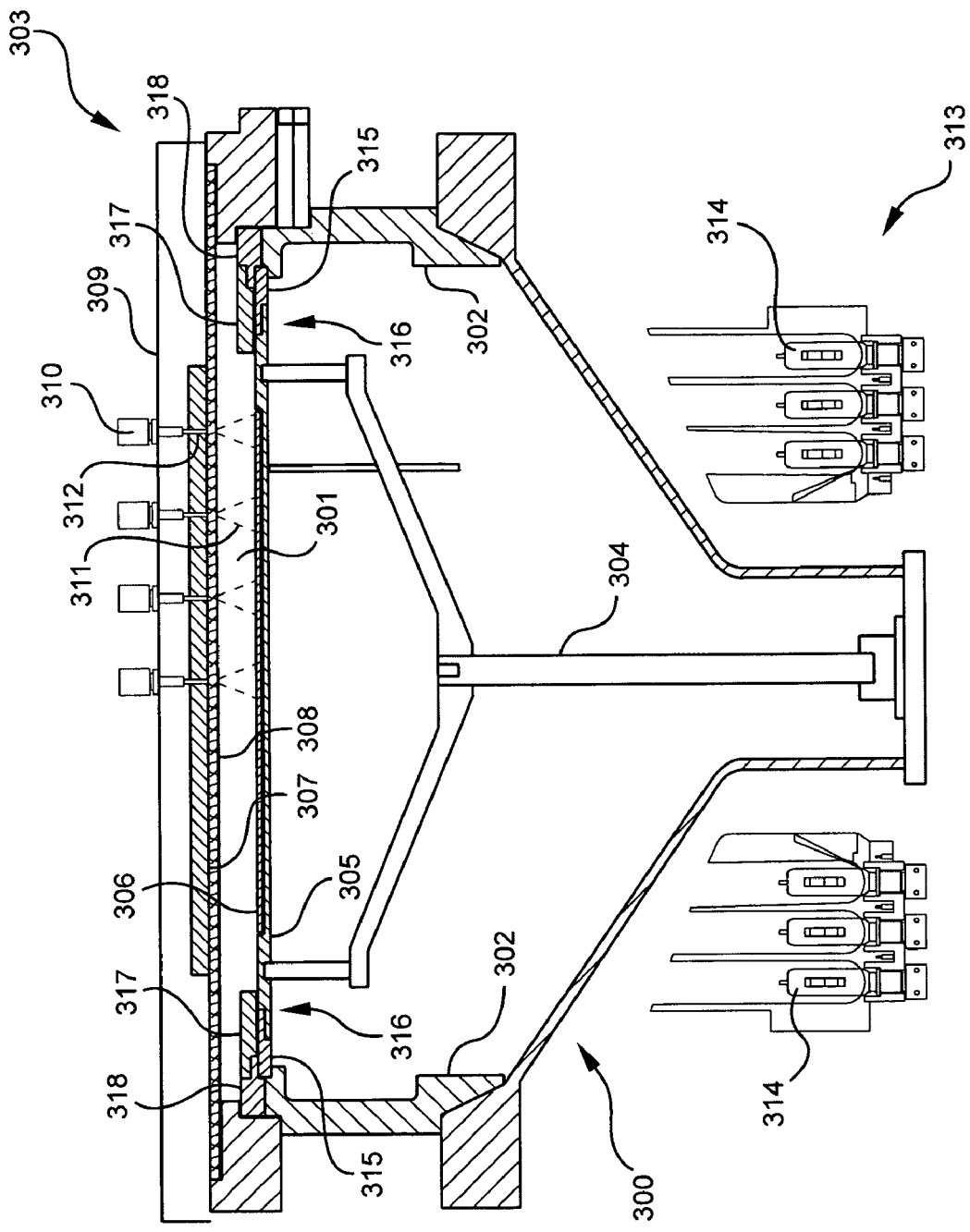
FIG. 9 is a cross-sectional view of another embodiment of a film formation system.

FIG. 9 illustrates another film formation system 300, which comprises a processing chamber 301 bounded by quartz sidewalls 302, and a top cover 303. A substrate support shaft 304 is rotatably disposed within the processing chamber 301, and comprises a susceptor 305 that holds a substrate 306. The susceptor 305 is made from a light, uniform and thermally conductive material (100 Watts/(meter ° C.) or better), such as graphite or solid silicon carbide, completely covers the bottom surface of the substrate 306, and is designed to heat the substrate 306 via conduction and radiation. The top cover 303 comprises a reflective surface 307 sandwiched between a quartz inner layer 308 and a steel outer layer 309. The reflective surface 307 reflects radiation emanating from the substrate 306 back towards the top surface of the substrate 306 to increase the effective emissivity of the substrate 306.

With this emissivity enhancement effect, the reflective surface 307 constantly reflects energy back to the substrate 306 until the substrate 306 reaches a uniform and isothermal condition regardless of the emissivity value or pattern on the surface of the substrate 306. To provide for pyrometric measuring of the temperature of the substrate 306, a plurality of optical probes 310 sample light emanating from the substrate 306, each optical probe 310 having a respective field of view 311 that does not extend beyond the substrate 306. Openings 312 in the reflective surface 307 may provide the respective fields of view 311 to the optical probes 310.

The film formation system 300 comprises a heating system 313 that is disposed below the substrate support 305. The heating system 313 comprises one or more lamps 314, which radiate light up into the chamber 301 to heat the bottom portion of the substrate support 305. All process heating is provided by the heating system 313. To prevent light from the lamps 314 from reaching the optical probes 310, the system 300 further comprises a graphite peripheral member 315, which may be a pre-heat ring that overlaps with the susceptor 305. There thus exists a region of overlap 316 between the susceptor 305 and the peripheral member 315, as disclosed in the above embodiment. Surfaces within this region of overlap 316 may be made optically rough or absorbent, such as with fine grooves or optical thin films, to better absorb light scattering through the gap separating the susceptor 304 from the peripheral member 315. A graphite upper peripheral member or light shield 317 may also be disposed above the region of overlap 316 to further block light scattering from the lamps 314. The light shield 317 may be supported by quartz upper sidewall 318.

The film formation system 300 is designed to prevent defects in the film formation process that are typically a result of pattern loading and emissivity variations of the substrate 306. The susceptor 305 provides a constant absortivity target for the heating system 313. The heating system 313 thus uniformly heats the susceptor 305, which, in turn, uniformly conductively heats the substrate 306, and with the reflective surface 307 further insures isothermal conditions across the substrate 306 to avoid pattern loading and emissivity effects. The reflective surface 307 provides two distinct functions: 1) it causes the probes 310 to measure the temperature of substrate 306 accurately, independently of the global emissivity of substrate 306, and 2) helps reduce pattern loading effects caused by the local, nanoscale, changes in the emissivity of the substrate 306.

Figure 10:
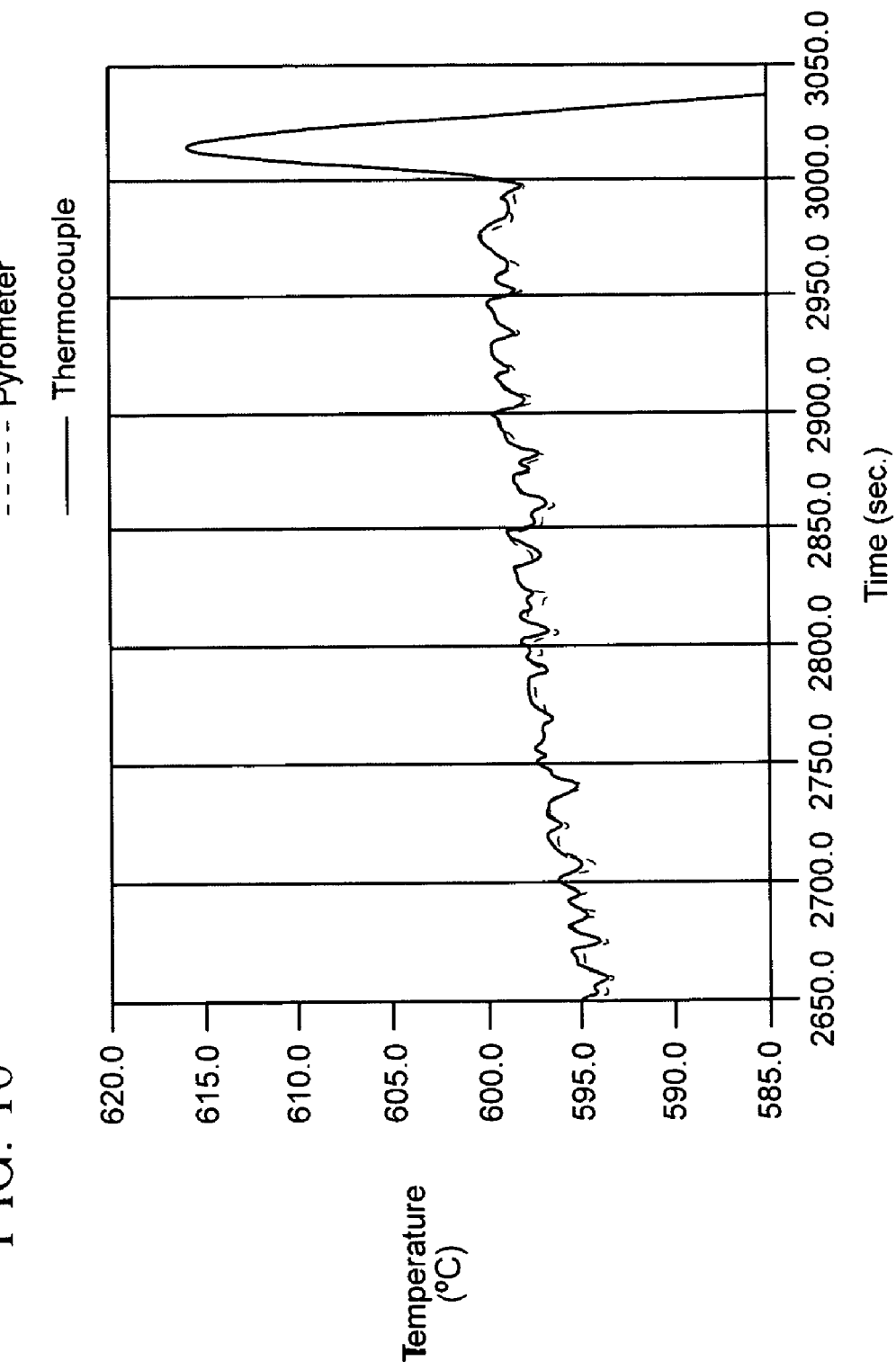
FIG. 10 is a graph illustrating experimental results of pyrometer temperature data and thermocouple temperature data versus time for the embodiment depicted in FIG. 9.

FIG. 10 is a graph illustrating experimental results of pyrometer temperature data against thermocouple temperature data for the film formation system 300. In order to validate the pyrometric temperatures measured by the optical probes 310, a special wafer analogous to that depicted in FIG. 5 was utilized that had four thermocouples welded to its top surface. The thermocouples were located directly underneath the optical probes 310 so that the pyrometric readings of the optical probes 310 could be directly compared. A high emissivity film (of about 0.95) was grown on the surface of the wafer prior to attaching the thermocouples. With this, the accuracy and repeatability of the optical probes 310 was tested by heating up the wafer through arbitrary thermal cycles and comparing the thermocouple readings with those taken by the optical probes 310. As shown in FIG. 10, which graphs a thermocouple and optical probe located near the center of the substrate, the system 300 provides tight correlation between the temperatures as measured by thermocouples versus temperature as measured through pyrometry via the optical probes 310.

Figure 11:
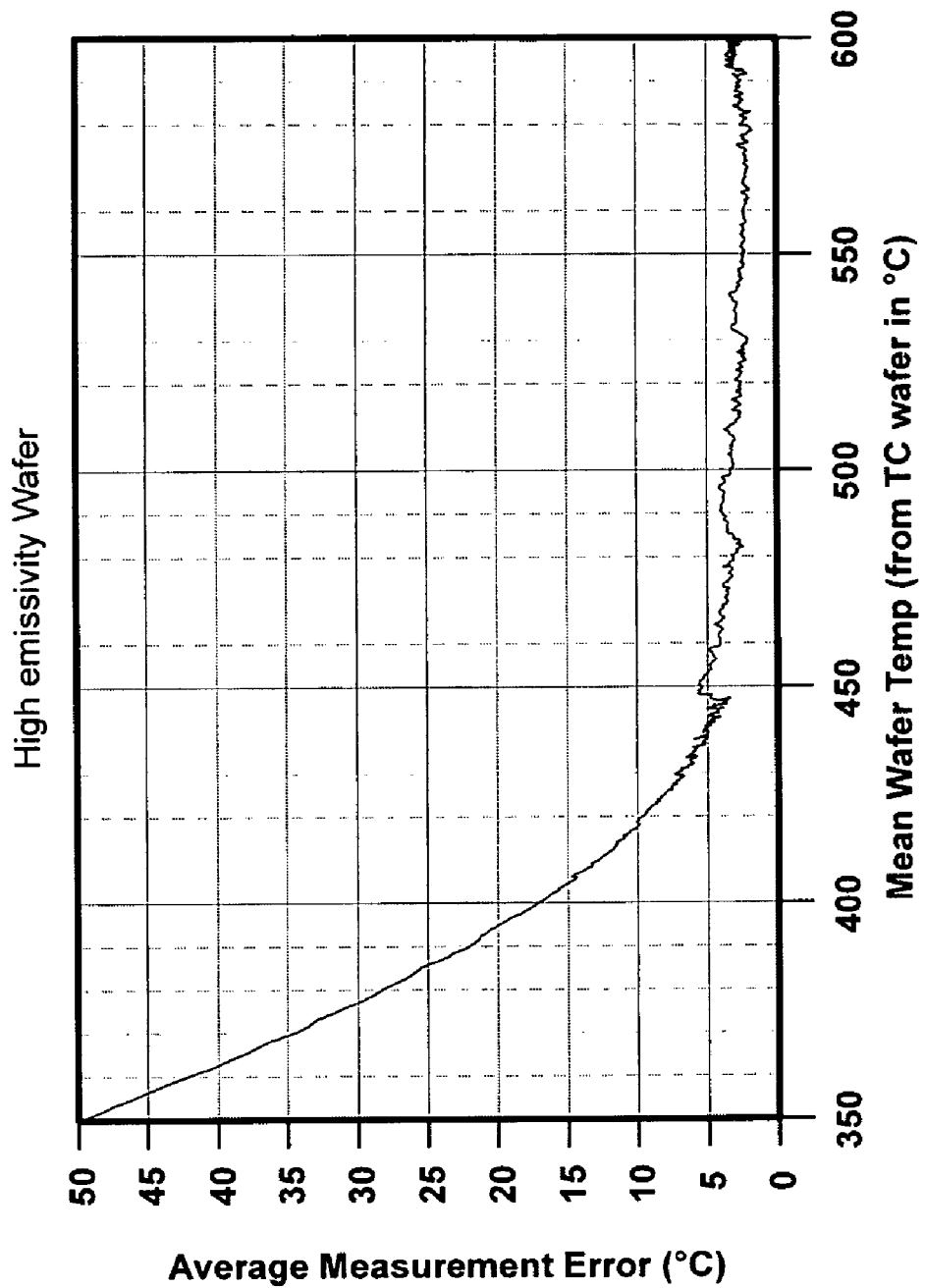
FIG. 11 is a graph of calculated average pyrometric temperature measurement error as a function of actual temperature of a processing chamber shown in FIG. 9.

FIG. 11 shows a summary of the calculated average measurement error across all optical probes 310 as a function of actual chamber 301 temperature obtained during these tests. As shown, for the temperature range of interest (>550° C.), the error due to stray light is on the order of 2° C.

Figure 12:
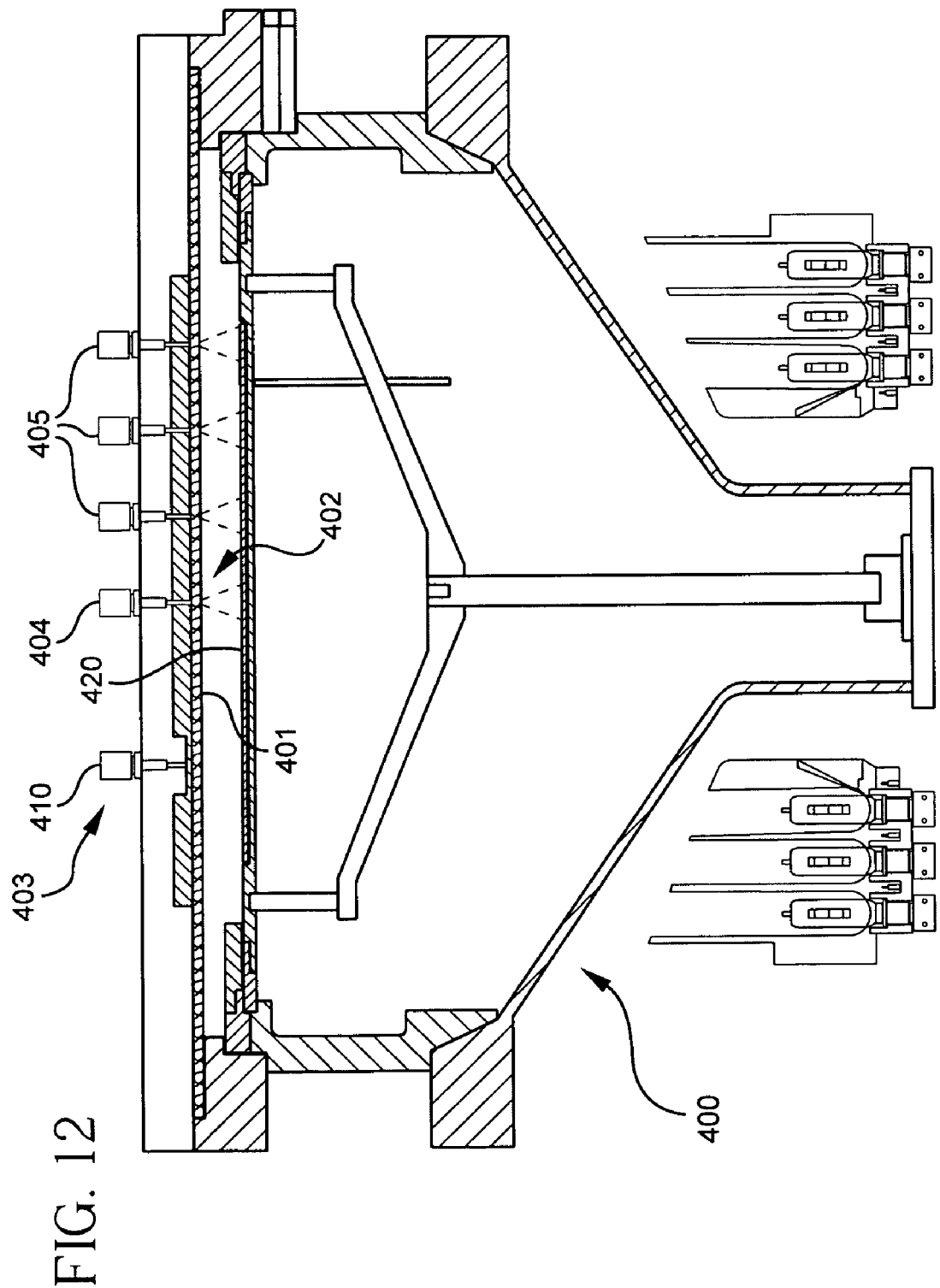
FIG. 12 is a cross-sectional view of yet another embodiment of a film formation system.

Another embodiment of a film formation system 400 which further provides for emissivity-effect corrections for pyrometric measurements, is shown in FIG. 12. The film formation system 400 is similar to the system 300 of FIG. 9; however, the system 400 further includes an emissometer 410 for measuring the actual emissivity of the substrate 420. The principle of operation of the emissometer 410 involves positioning an optical probe 403 in the chamber 402, but for this optical probe 403 the enhanced effective emissivity provided by the reflective surface 401 is reduced or eliminated. The optical probe 403 only sees the direct radiation from the substrate 420, without any reflected radiation. That is, the radiative power the optical probe 403 measures is:

$$\Phi(\lambda, T) = \varepsilon \frac{2\pi C_1}{\lambda^5 \left(e^{C_2/\lambda T} - 1\right)}$$

By comparing the temperature measured by the optical probe 403 to that measured by a neighboring optical probe 404 that experiences the full enhanced emissivity effect of the reflective surface 401, it is possible to calculate the actual emissivity of the substrate 420. For example, the emissivity of the substrate 420 may be calculated as:

$$\frac{-\left[-\exp\left[\frac{C2}{(\lambda \cdot Tmeas)}\right] + RE \cdot \exp\left[\frac{C2}{(\lambda \cdot Tmeas)}\right] - RE + \exp\left[\frac{C2}{(\lambda \cdot (Tmeas - \text{delta}))}\right] - R3 \cdot \exp\left[\frac{C2}{(\lambda \cdot (Tmeas - \text{delta}))}\right] + R3\right]}{\left[-RE \cdot \exp\left[\frac{C2}{(\lambda \cdot Tmeas)}\right] + RE + R3 \cdot \exp\left[\frac{C2}{(\lambda \cdot (Tmeas - \text{delta}))}\right] - R3\right]}$$

where Tmeas is the measured wafer temperature, delta is the difference in temperature measured by the temperature probe 404 and the emissometer probe 403, R3 is the reflectivity of the reflective surface 401 and RE is the reflectivity of the cavity around the emissometer 410. The other constants are given as in Equation 1. Alternatively, several substrates 420 of known emissivity from 0.3 to about 0.95 may be run in the chamber 402, and the temperature delta between the emissometer 410 and regular pyrometer 404 may be measured to construct a calibration curve. This calibration curve may be fit with an exponential function, and subsequently used to determine the emissivity of an unknown substrate 420. This emissivity value is then used to perform a correction to the temperature reported by the pyrometric optical probes 405.

Figure 13:
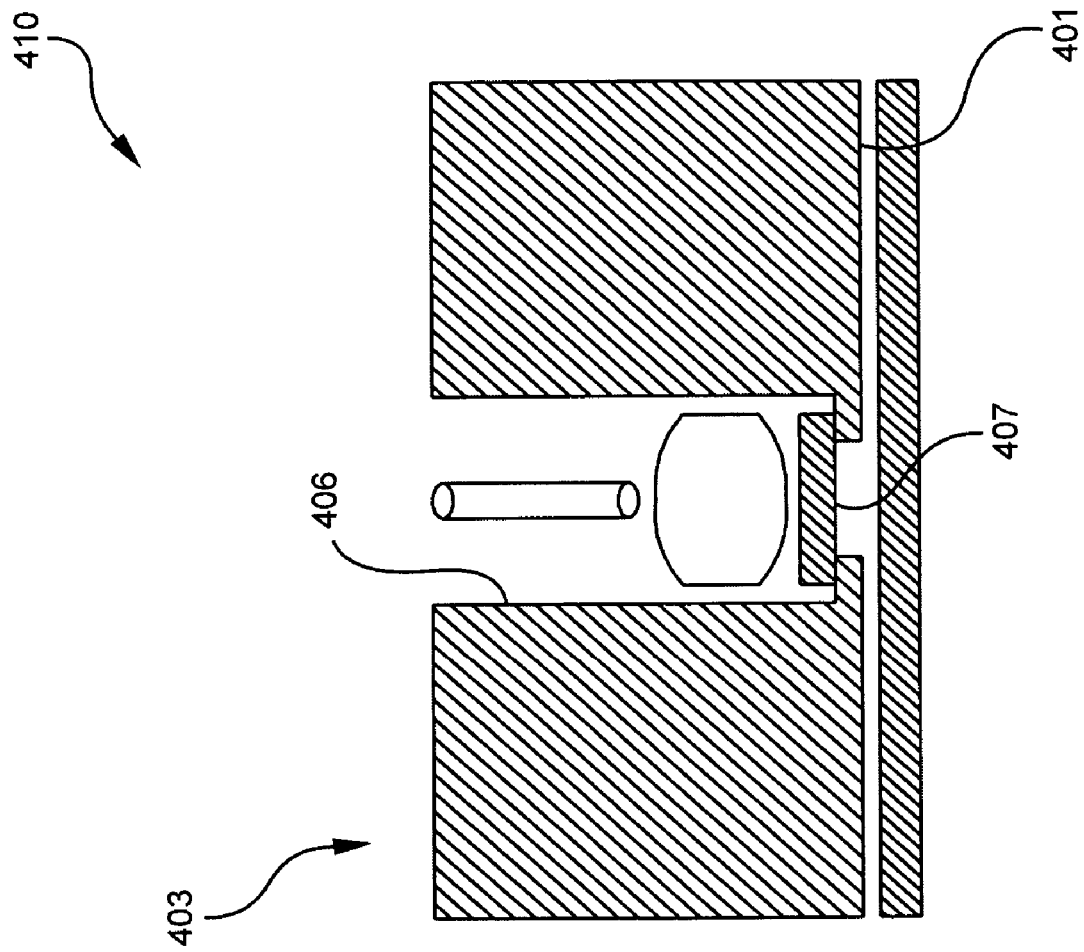
FIG. 13 is a cross-sectional view of an embodiment of an emissometer depicted in FIG. 12.

FIG. 13 illustrates an embodiment of the emissometer 410. The optical probe 403 is located in an area of the reflective surface 401 where a relatively large diameter hole 406 is drilled or etched. The diameter of hole 406 may correlate with the field of view of the optical probe 403 and the distance to the substrate 420. It is desired that the optical probe 403 collects light that comes directly from the substrate 420 without having reflected from the reflective surface 401, and thus that the optical probe 403 receives none of the emissivity enhancement provided by the reflective surface 401. Hence, it is desirable for the diameter of the hole 406 to be as wide as possible. However, because the substrate 420 emits radiation at almost all angles, the optical probe 403 will almost always collect some emissivity enhancement radiation unless the hole 406 is made very large. Making the hold 406 very large may be undesirable, though, as this tends to create a cold spot on the substrate 420. Since the substrate 420 may rotate, this cold spot will create a cold ring on the substrate 420. A suitable compromise may be provided by making the diameter of the hole 406 the same size as the field of view on the surface of the substrate 420 of the optical probe 403. In one embodiment, the diameter of hole 406 may range from 0.5 inches to 2 inches. In another embodiment, the diameter may be about 0.75 inches. In general, trigonometry may be used, and the diameter may be a function of the angle of view of the optical probe 403 and the distance from the optical probe 403 and the substrate 420. The width of the hole 406 effectively eliminates the emissivity enhancement effect of the reflective surface 401 for the radiation reaching this probe 403. To prevent the large hole 406 in the reflective surface 401 from having a negative effect on the temperature of the substrate 420, a hot mirror 407 is positioned to cover the hole 406. The hot mirror 407 is designed to reflect off-axis light back to the substrate 420, which minimizes the amount of heat lost through the hole 406. Such a hot mirror may be obtained, for example, from Sekidenko. Because of hot mirror 407, only radiation emitted directly underneath the probe 403 reaches the emissometer 410. This radiation is not enhanced by the reflective surface 401, and can then be compared to a regular pyrometric probe 404, 405 to compute the emissivity of the substrate 420, as described above. When the emissivity of the substrate 420 is known, the temperature of the substrate 420 can be accurately determined using Eqn. 1, and the radiative power detected by the optical probes 404, 405.

Additionally, it is possible to utilize multiple emissometers, each with its respective field of view of the substrate, to determine the emissivity of the substrate over a corresponding plurality of regions. The emissivity of the substrate in one region as measured by the emissometer for that region may then be used to accurately compute the temperature of that region for a corresponding pyrometer with a field of view that encompasses the region. In this manner, the temperature distribution across the substrate may be more accurately measured, and hence more accurately controlled.

Figure 14:
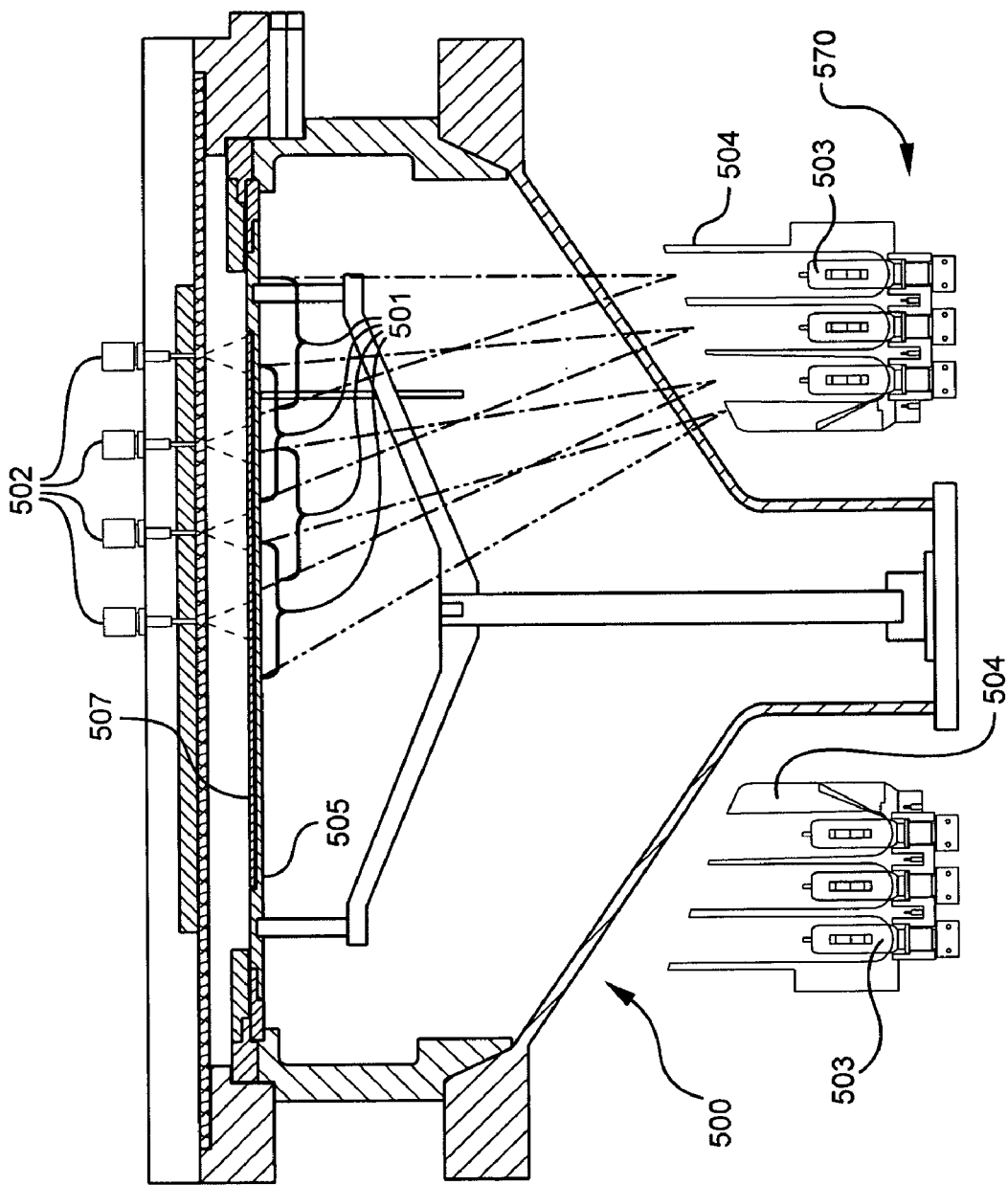
FIG. 14 is a cross-sectional view of another embodiment of a film formation system.

According to another embodiment, an adjustable source of energy is provided to control the temperature within a film formation chamber. Referring now to FIG. 14 system 500 includes a four-zone irradiative heating system 510, with each zone 501 capable of being independently adjusted based on temperature feedback received from a corresponding radial distribution of pyrometric optical probes 502. The irradiative heating system 510 is disposed beneath susceptor 505, and comprises a plurality of lamps 503 and reflectors 504. Adjustment to the angles and orientations of the lamps 503 and reflectors 504 creates the independently adjustable heating zones 501.

Figure 15:
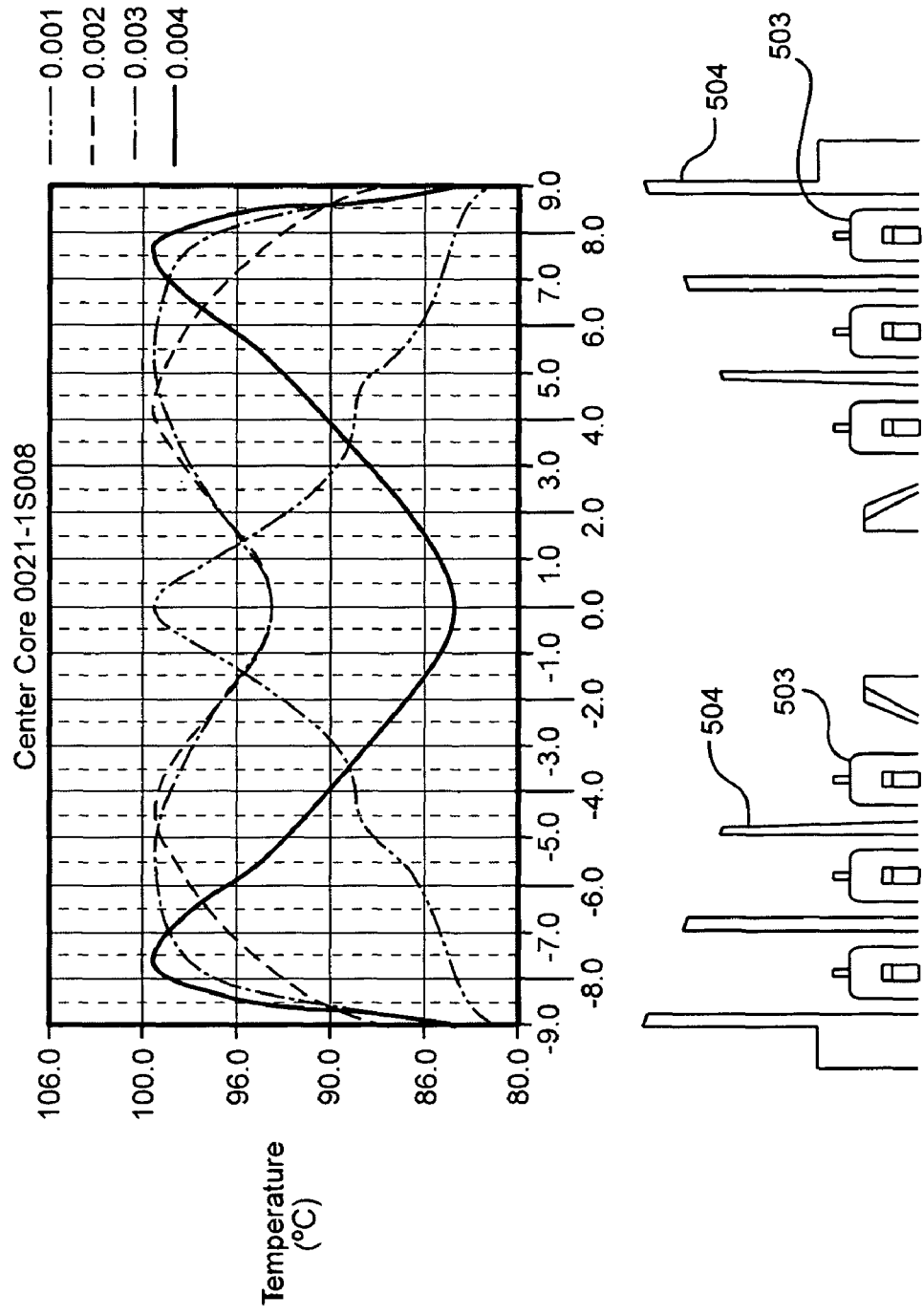
FIG. 15 is a graph of heating distributions for heating zones of a heating system depicted in FIG. 14.

The heating zones 501 combine to produce a heating pattern that can be adjusted to be uniform across the bottom surface of the susceptor 505. The bottom surface of the susceptor 505 may be engineered to be maximally absorbing of the radiation emitted by the lamps 503, such as by making use of optical films, grooves, etc. A graph of the heating pattern generated by the heating system 510 is presented in FIG. 15, and shows the heat distribution measured across the susceptor 505 for each individual heating zone 501 when turned on independently. Each heating zone 501 heats the substrate 507 at a specific radius on the susceptor 505 (i.e., the heating distribution of each zone 501 is symmetric about the rotational center of the susceptor 505), and hence at a specific radius on the substrate 507, and all heating zones 501 overlap just enough to create a uniform heating distribution. It is expected that the heating zones 501 of the heating pattern indicated in FIG. 15 superimpose to produce a temperature distribution across the substrate 507 with better than 1° C. for 1σ. Moreover, as discussed above, exclusively heating the substrate 507 from the bottom directly reduces emissivity and pattern load effects.

While the foregoing is directed to embodiments of the present invention, other and further embodiments of the invention may be devised without departing from the basic scope thereof, and the scope thereof is determined by the claims that follow.

The invention claimed is:

1. A substrate processing system comprising:
   a processing chamber adapted for the formation of films on the substrate, the chamber including a sidewall surrounding the periphery of the chamber and having a first retaining edge;
   an irradiative heating system comprising radiation lamps for providing heating radiation directed towards the substrate;
   a first peripheral member having an outer peripheral edge in contact with the first retaining edge of the sidewall and an inner peripheral edge extending into the processing chamber which blocks light from the irradiative heating system from entering the processing chamber when the irradiative heating system is operative during processing;

a substrate support adapted to support the substrate, the substrate support disposed within the processing system and having an outer edge portion that overlaps the inner peripheral edge of the first peripheral member; and a second peripheral member adjacent to the sidewall and extending into the processing chamber to overlap with the inner peripheral edge and the outer edge portion.

2. The substrate processing system of claim 1 wherein the substrate support is rotatably mounted in the processing chamber, and the outer edge portion does not contact the inner peripheral edge.

3. The substrate processing system of claim 1, further comprising a top cover disposed above the substrate support to enclose the processing chamber, the top cover comprising a reflective surface for reflecting light emanating from the region of the substrate support back towards the region of the substrate support.

4. The substrate processing system of claim 3, wherein the reflective surface is adapted to reflect light emanating from the substrate back towards the substrate to increase the effective emissivity of the substrate.

5. The substrate processing system of claim 2, wherein a surface of the inner peripheral edge facing the outer edge portion is adapted to absorb light.

6. The substrate processing system of claim 5, wherein the surface of the inner peripheral edge facing the outer edge portion comprises a roughened surface.

7. The substrate processing system of claim 2, wherein a surface of the outer edge portion facing the inner peripheral edge is adapted to absorb light.

8. The substrate processing system of claim 7, wherein the surface of the outer edge portion facing the inner peripheral edge comprises a plurality of grooves.

9. The substrate processing system of claim 1 wherein the substrate support is a ring-shaped structure contacting the edges of the substrate.

10. A substrate processing system comprising:
a processing chamber adapted for the formation of films on the substrate, the chamber including a sidewall surrounding the periphery of the chamber and having a first retaining edge;
an irradiative heating system comprising radiation lamps for providing heating radiation directed towards the substrate;
a first peripheral member having an outer peripheral edge in contact with the first retaining edge of the sidewall and an inner peripheral edge extending into the processing chamber which blocks light from the irradiative heating system from entering the processing chamber when the irradiative heating system is operative during processing;
and a substrate support adapted to support the substrate, the substrate support disposed within the processing system and having an outer edge portion that overlaps the inner peripheral edge of the first peripheral member;
a top cover disposed above the substrate support to enclose the processing chamber, the top cover comprising a reflective surface for reflecting light emanating from the region of the substrate support back towards the region of the substrate support, wherein the reflective surface is adapted to reflect light emanating from the substrate back towards the substrate to increase the effective emissivity of the substrate; and
a plurality of optical probes for collecting light emanating from the substrate, the reflective surface comprising a plurality of openings to provide fields of view of the substrate to the optical probes.

11. The substrate processing system of claim 10, wherein the field of view of any optical probe does not extend beyond the substrate.

12. The substrate processing system of claim 10, wherein the optical probes function as pyrometers.

13. The substrate processing system of claim 10, wherein the optical probes are approximately equidistantly radially spaced above the substrate.

14. The substrate processing system of claim 10, further comprising an emissometer for measuring the actual emissivity of the substrate, wherein a temperature of the substrate is calculated utilizing output from at least one of the optical probes and the emissometer.

15. A substrate processing system comprising:
a processing chamber adapted for the formation of films on the substrate, the chamber including a sidewall surrounding the periphery of the chamber and having a first retaining edge;
an irradiative heating system comprising radiation lamps for providing heating radiation directed towards the substrate;
a first peripheral member having an outer peripheral edge in contact with the first retaining edge of the sidewall and an inner peripheral edge extending into the processing chamber which blocks light from the irradiative heating system from entering the processing chamber when the irradiative heating system is operative during processing;
a substrate support adapted to support the substrate, the substrate support disposed within the processing system and having an outer edge portion that overlaps the inner peripheral edge of the first peripheral member and the substrate support comprising a susceptor, a bottom portion of the susceptor adapted to entirely cover a bottom surface of the substrate and to be heated by the irradiative heating system, wherein the susceptor is made from a uniform material with a thermal conductivity of at least 100 Watts/(meter ° C.) to provide a constant absorptivity target for the irradiative heating system, and wherein process heating of the substrate is performed exclusively by the irradiative heating system.

16. A substrate processing system comprising:
a processing chamber adapted for the formation of films on the substrate, the chamber including a sidewall surrounding the periphery of the chamber and having a first retaining edge;
an irradiative heating system comprising radiation lamps for providing heating radiation directed towards the substrate;
a first peripheral member having an outer peripheral edge in contact with the first retaining edge of the sidewall and an inner peripheral edge extending into the processing chamber which blocks light from the irradiative heating system from entering the processing chamber when the irradiative heating system is operative during processing;
a substrate support adapted to support the substrate, the substrate support disposed within the processing system and having an outer edge portion that overlaps the inner peripheral edge of the first peripheral member and the substrate support comprising a susceptor, a bottom portion of the susceptor adapted to entirely cover a bottom surface of the substrate and to be heated by the irradiative heating system, wherein the irradiative heating system comprises a plurality of lamps, the lamps generating a plurality of heating zones across the substrate and the heating zones overlap to create a substantially uniform heating distribution across the substrate, and process heating of the substrate is performed exclusively by the irradiative heating system.

17. The substrate processing system of claim 10 wherein the substrate support is a ring-shaped structure contacting the edges of the substrate.

18. The substrate processing system of claim 10 wherein the substrate support is rotatably mounted in the processing chamber, and the outer edge portion does not contact the inner peripheral edge.

19. The substrate processing system of claim 18, wherein a surface of the outer edge portion facing the inner peripheral edge is adapted to absorb light.

20. The substrate processing system of claim 19, wherein the surface of the outer edge portion facing the inner peripheral edge comprises a plurality of grooves.

21. The substrate processing system of claim 18, wherein a surface of the inner peripheral edge facing the outer edge portion is adapted to absorb light.

22. The substrate processing system of claim 21, wherein the surface of the inner peripheral edge facing the outer edge portion comprises a roughened surface.

23. The substrate processing system of claim 16 wherein the substrate support is rotatably mounted in the processing chamber, and the outer edge portion does not contact the inner peripheral edge.

24. The substrate processing system of claim 23, wherein a surface of the outer edge portion facing the inner peripheral edge is adapted to absorb light.

25. The substrate processing system of claim 24, wherein the surface of the outer edge portion facing the inner peripheral edge comprises a plurality of grooves.

26. The substrate processing system of claim 23, wherein a surface of the inner peripheral edge facing the outer edge portion is adapted to absorb light.

27. The substrate processing system of claim 26, wherein the surface of the inner peripheral edge facing the outer edge portion comprises a roughened surface.

* * * * *